United States Patent
Moran et al.

(10) Patent No.: US 9,252,734 B2
(45) Date of Patent: Feb. 2, 2016

(54) HIGH FREQUENCY HIGH ISOLATION MULTICHIP MODULE HYBRID PACKAGE

(71) Applicant: NATIONAL INSTRUMENTS CORPORATION, Austin, TX (US)

(72) Inventors: Tamir Moran, Petaluma, CA (US); Gregory S. Gonzales, Sebastopol, CA (US)

(73) Assignee: National Instruments Corporation, Austin, TX (US)

( * ) Notice: Subject to any disclaimer, the term of this patent is extended or adjusted under 35 U.S.C. 154(b) by 193 days.

(21) Appl. No.: 13/772,874

(22) Filed: Feb. 21, 2013

(65) Prior Publication Data

US 2014/0078683 A1 Mar. 20, 2014

Related U.S. Application Data

(60) Provisional application No. 61/701,171, filed on Sep. 14, 2012.

(51) Int. Cl.
| | |
|---|---|
| *H03H 5/02* | (2006.01) |
| *H01R 13/7197* | (2011.01) |
| *H01L 23/66* | (2006.01) |
| *H01L 25/16* | (2006.01) |

(52) U.S. Cl.
CPC ............ *H03H 5/02* (2013.01); *H01L 23/66* (2013.01); *H01L 25/16* (2013.01); *H01R 13/7197* (2013.01); *H01L 2223/665* (2013.01); *H01L 2223/6633* (2013.01); *H01L 2223/6683* (2013.01); *H01L 2224/48091* (2013.01); *H01L 2224/48229* (2013.01); *Y10T 29/4913* (2015.01)

(58) Field of Classification Search
CPC ........................................... H03H 5/02
USPC .............. 361/728, 760; 29/832; 174/253, 255
See application file for complete search history.

(56) References Cited

U.S. PATENT DOCUMENTS

| | | | | |
|---|---|---|---|---|
| 4,025,997 A | * | 5/1977 | Gernitis et al. ............... | 428/621 |
| 4,129,897 A | * | 12/1978 | Telewski et al. .............. | 361/757 |
| 4,372,037 A | * | 2/1983 | Scapple et al. ................. | 29/613 |
| 5,049,978 A | * | 9/1991 | Bates et al. .................... | 257/686 |
| 5,218,357 A | * | 6/1993 | Sukamto et al. .............. | 342/351 |
| 6,627,992 B2 | * | 9/2003 | Ammar ......................... | 257/728 |
| 7,663,064 B2 | * | 2/2010 | Dutta et al. .................... | 174/261 |
| 2002/0027531 A1 | * | 3/2002 | Brown et al. .................. | 343/895 |
| 2002/0084852 A1 | * | 7/2002 | Cook ..................... | H03F 3/602 330/286 |
| 2006/0120056 A1 | * | 6/2006 | Sasaki .......................... | 361/735 |

OTHER PUBLICATIONS http://www.newark.com/amphenol-rf/31-28/rf-coaxial-adapter-bnc-jack-uhf/dp/39F074.*

* cited by examiner

*Primary Examiner* — Dion R Ferguson
*Assistant Examiner* — Mandeep S Buttar
(74) *Attorney, Agent, or Firm* — Meyertons Hood Kivlin Kowert & Goetzel, P.C.; Jeffrey C. Hood

(57) ABSTRACT

In one embodiment, a high frequency module may include a substrate. The substrate may include a first surface and a second surface substantially opposite of the first surface. The high frequency module may include a component coupled to the second surface. A direct current may be provided to the component using the substrate. The high frequency module may include a core coupled to the second surface of the substrate. In some embodiments, the core may include at least one opening extending through the core. The component may be positioned in at least one of the openings. In some embodiments, the high frequency module may include a cover coupled to the core. The component may be positioned in at least one of the openings between the substrate and the cover.

25 Claims, 4 Drawing Sheets

HIGH FREQUENCY HIGH ISOLATION MULTICHIP MODULE HYBRID PACKAGE

PRIORITY CLAIM

This application claims priority to U.S. Provisional Patent Application No. 61/701,171 to Moran et al. entitled "A High Frequency High Isolation Multichip Module Hybrid Package" filed on Sep. 14, 2012, all of which is incorporated by reference herein.

FIELD OF THE INVENTION

This disclosure relates generally to component packages, and more particularly to hybrid packages.

DESCRIPTION OF THE RELATED ART

Traditional high frequency multi chip module packages for Test & Measurement (T&M), radar, or other military applications often use DC feeds to deliver bias and control signals into a shielded microwave cavity. This type of a package is often referred to as a microcircuit (in a T&M context), but may also be referred to as a hybrid package (e.g., as depicted in FIG. 1). FIG. 1 depicts an exploded view of an embodiment of a high frequency high isolation multichip module hybrid package 100 including DC feeds 110, a metal housing 120, a cover 130, and a printed circuit board (PCB) 140. The metal housing contains the high frequency MMICs, various transmission lines, bond wires and DC feeds, while the PCB contains the low frequency circuits such as power supply regulation and digital logic. The metal housing may contain high isolation channels or a single cavity in which the MMICs are placed and connected to one another, but in either case, it is generally connected to the PCB with DC feeds. DC feeds are not limited from being inserted through the PCB and may be inserted through the side of a hybrid package. The DC feed is made up of a glass to metal seal, with a tubular capacitor and a conductive pin that runs through the capacitor and glass and sticks out on both sides. It is used to pass the signals from the PCB into the metal housing while keeping the high frequency signals isolated in the metal housing. Ideally, the level of high frequency isolation provided by the DC feed is dependent on the capacitance value, which can range from a few pF to 47000 pF.

SUMMARY OF THE INVENTION

In one embodiment, a high frequency module may include a substrate. The substrate may include a first surface and a second surface substantially opposite of the first surface, and possibly other surfaces stacked between the first and second surface. An embodiment may include, but is not limited to, a printed circuit board stack. The high frequency module may include a component coupled to the first or second surface. A direct current may be provided to the component using the substrate. The high frequency module may include a core coupled to the second surface of the substrate. In some embodiments, the core may include at least one opening extending through the core. The component may be positioned in at least one of the openings. The core may include at least one electrical connector which functions to convey an electrical signal through the core to the component. In some embodiments, the high frequency module may include a cover coupled to the core. The component may be positioned in at least one of the openings between the substrate and the cover.

In some embodiments, hybrid module 200 may include at least one connection to the second, or other stacked surfaces of the substrate coupled to the second surface of the substrate.

In some embodiments, at least two of the component are electrically coupled to at least one bypass capacitor coupled to the second surface of the substrate.

In some embodiments, at least one of the electrical connectors includes a radio frequency connector. In some embodiments, at least one of the electrical connectors includes a coaxial radio frequency connector.

In some embodiments, a core may be formed from a metal (e.g., aluminum). In some embodiments, a portion of the second surface of the substrate comprises metal positioned between the substrate and the core and the component.

In some embodiments, a second component may be coupled to the second surface of the substrate outside of a perimeter of the core. In some embodiments, a module may be coupled to the second surface of the substrate outside of a perimeter of the core.

In some embodiments, a second component may be coupled to the first surface of the substrate. The second component may be electrically coupled to the component coupled to the second surface of the substrate. In some embodiments, a second core may be coupled to the first surface of the substrate. The second core may include at least one second opening extending through the second core such that the second component is positioned in at least one of the second openings.

In some embodiments, a second cover may be coupled to the first surface of the substrate.

BRIEF DESCRIPTION OF THE DRAWINGS

The following detailed description makes reference to the accompanying drawings, which are now briefly described.

Figure 1:
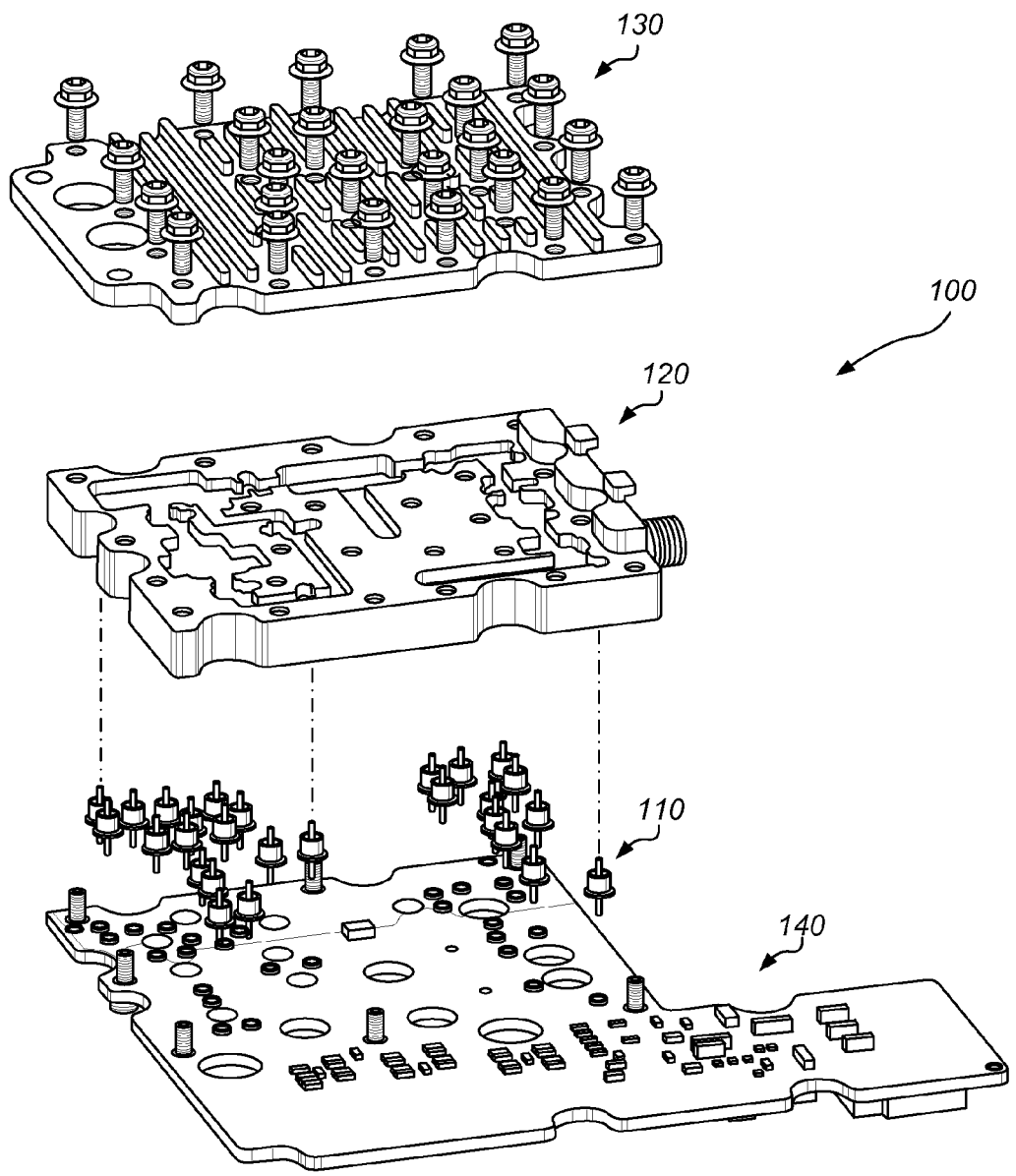
FIG. 1 depicts an exploded view of an embodiment of a high frequency high isolation multichip module hybrid package with DC feeds isolated by glass to metal seals, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third component electrically connected to the module substrate" does not preclude scenarios in which a "fourth component electrically connected to the module substrate" is connected prior to the third component, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112, paragraph six, interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF THE INVENTION

Traditional high frequency hybrid packages are generally assembled in the following manner. A core is first formed and includes a machined housing which is typically formed from metal. Channels are formed in the core which may be anywhere from, for example, 60 mils to 100 mils deep. Channels or openings may vary in depth and the depth may be dependent upon the ultimate purpose of the finished package. Radio frequency connectors are coupled to the core. Radio frequency connectors are typically coupled to the core using glass to metal seals and a threaded connector. Direct current (DC) feeds are then soldered or press fit into the core. Components designed to function at high frequencies (e.g., microwave frequencies) as well as thin film circuits are then coupled to a bottom surface of the channels of the core. Components designed to function at high frequencies may include monolithic microwave integrated circuits (MMICs). Components may be coupled to the core using adhesives such as epoxy. The high frequency path through the core may be established by wire bonding to electrically couple components to thinfilms, DC control signals to DC feed pins, etc. A cover is then positioned on and coupled to the core such that the channels formed in the core are covered enclosing the circuitry positioned in the channels. The underside of the core is then coupled to a substrate.

Figure 2:
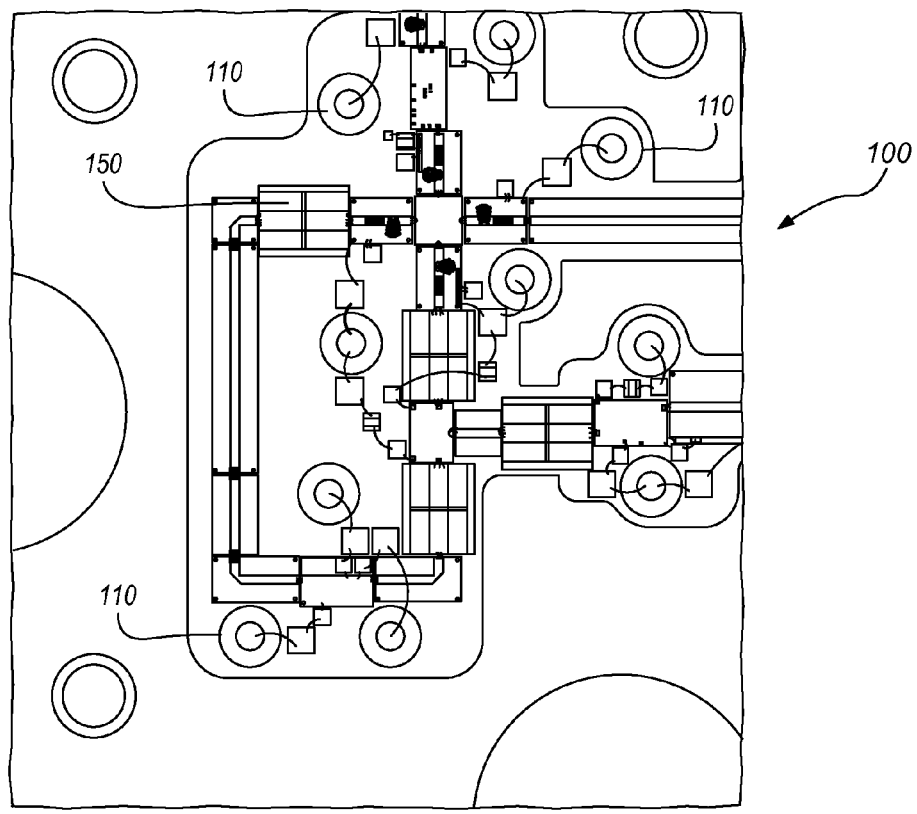
FIG. 2 depicts a portion of an embodiment of a high frequency high isolation multichip module hybrid package with DC feeds isolated by glass to metal seals and a cover portion removed, according to the prior art.

There are many problems associated with using direct current feeds in hybrid packages and especially as it relates to incorporating them into the process described above. For example, the DC feeds 110 are relatively large in comparison to the MMICs 150 and other components inside the metal housing 120, but they are typically required to be placed in close proximity to these circuits. High frequency, high isolation microcircuit packages typically require channelization in order to keep microwave energy confined to a waveguide below cutoff mode as shown in FIG. 2. High frequency circuits need to be placed in close proximity to other high frequency circuits in order to minimize transmission loss. FIG. 2 depicts a portion of an embodiment of a high frequency high isolation multichip module hybrid package 100 with DC feeds 110 isolated by glass to metal seals and a cover portion removed. The size of the DC feeds forces the high frequency cavities to be larger than they would otherwise have to be, which limits the highest frequency of operation and makes the overall size of the package larger. The dimensions of the channels at least in part determines the frequency of operation which the hybrid package is capable of handling. While larger packages are never desired, they are typically tolerable in traditional T&M "boxed" instruments, but cannot be tolerated in PXI module where space is at a premium. Space is also limited in handheld instruments.

The use of DC feeds limits the complexity of microwave circuits because it is not practical to use a large number of DC feeds in a single package for mechanical reasons such as high insertion force and alignment of a core to the PCB to ensure all feeds are properly connected. In more extreme examples, a microcircuit can end up with as many as 25-30 DC feeds. DC feeds are fairly expensive ($8-$10 each in volume) and account for as much as 15%-20% of final cost of goods sold (COGS). Each DC feed requires a socket on the substrate. The sockets are thru hole parts, which requires a non standard process to be added to the build of the substrate. Besides the additional cost of the socket itself the additional through hole process is undesirable and further increases the cost of the substrate.

Traditional channelized microcircuits also have a disadvantage associated with the limitation of having to bond inside a relatively deep cavity (60 mils to 100 mils deep) machined in the metal housing. Bonding tips cannot bond too close to cavity walls of the channels, which also forces the cavity size to be larger than necessary in many cases. Design rules typically require that bondable objects be kept as much as 30 mils away from cavity walls. There's typically some complexity associated with the assembly of thinfilm circuits in the area of the radio frequency (RF) connector (sometimes referred to as the transition circuit). Some RF connectors use a glass to metal seal that has to be installed prior to the MMIC and thinfilm epoxy stage. In this case the assembler has to place the transition circuit in the cavity and slide it under the RF pin. This rules out the use of automatic pick and place machines. The alternative to date is to use a lower quality RF connector without a glass to metal seal, which degrades reliability and complicates the rework process if there is damage to one of these connectors.

A high frequency module which is not reliant on the use of DC feeds and the limits their use impose would be desirable.

A high frequency hybrid module 200 may eliminate the need for DC feeds (e.g., glass to metal seal based DC feeds). In one embodiment, a high frequency module may include a substrate 210. The substrate may include a first surface 220 and a second surface 230 substantially opposite of the first surface. The substrate may include other surfaces stacked between the first and second surface. An embodiment may include, but is not limited to, a printed circuit board (PCB) stack. The high frequency module may include a component 240 coupled to second surface 230. A direct current may be provided to at least one of the component using the substrate. The high frequency module may include a core 250 coupled to second surface 230 of substrate 210. In some embodiments, core 250 may include at least one opening 260 extending through the core. The component may be positioned in at least one of the openings.

In some embodiments, a substrate 210 may be employed as a carrier for high frequency components (e.g., component 240). The substrate may function as a bias and control board. Substrate 210 may include multi-layer printed circuit boards. Substrate 210 may deliver power and/or control commands to component 240 using traces and vias 265 in the multi-layer substrate. Isolation of portions of the substrate, where necessary, may be achieved, in some embodiments, by taking advantage of multiple layers inside the PCB and ground planes/vias that separate critical traces.

Figure 3:
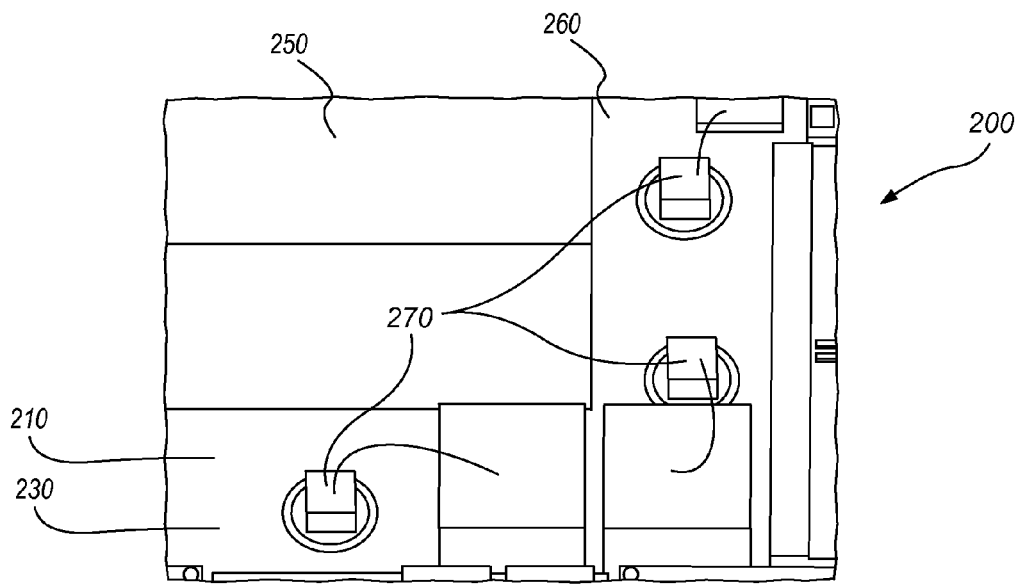
FIG. 3 depicts a portion of an embodiment of a hybrid package including multiple bonding blocks coupled to a substrate.

In some embodiments, hybrid module 200 may include at least one bonding block 270 coupled to first surface 220 and/or second surface 230 as necessary of substrate 210. Surface mount bypass capacitors may be used in place of the capacitance of the DC feeds. Bypass capacitors, or bonding blocks, may be positioned on a surface of substrate 210 where ever they are needed. Bypass capacitors with a variety of standard values and voltage ratings may be used as is needed for a particular hybrid module. In some embodiments, a bypass capacitor, or bonding block, may be bonded directly to a surface of the substrate itself. In some embodiments, a three-dimensional bypass capacitor, or bonding block, may be bonded (e.g., with epoxy 275, etc.) to the surface of the substrate. The bypass capacitor, or bonding block, may include a substantially cubic shape. The bypass capacitor may be formed from a dielectric material (e.g., gold, etc.). We might want to say that in one embodiment a surface mountable capacitor can be used. In another embodiment a wire bondable capacitor can be used. An example of the scale of a bonding block may include a cubic shape with dimensions of about 0.010"×0.010"×0.010". FIG. 3 depicts a portion of an embodiment of a high frequency high isolation multichip module hybrid package 200 including multiple bypass capacitors 270 coupled to substrate 210.

Figure 4:
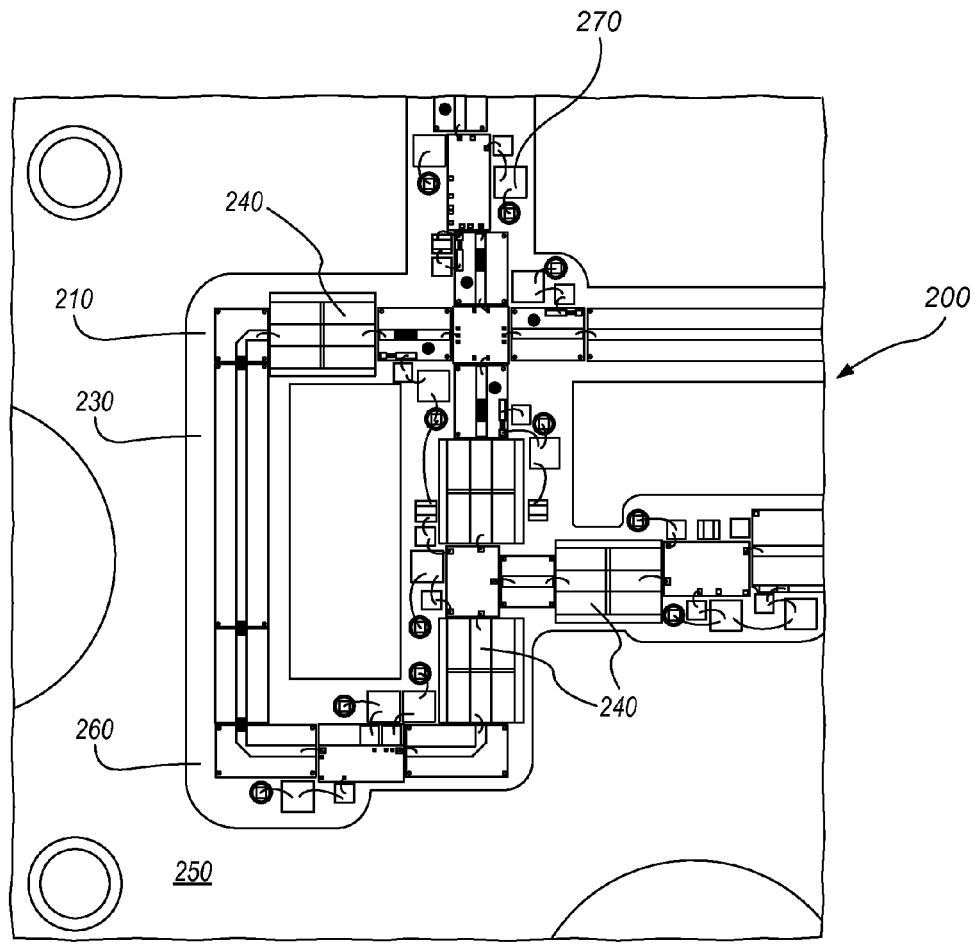
FIG. 4 depicts a top view of a portion of an embodiment of a hybrid package including multiple bonding blocks and multiple components coupled to a substrate.

Bonding blocks 270 are significantly smaller than standard DC feeds 110. Smaller bypass capacitors, or bonding block, allow openings 260 to be significantly smaller. Smaller openings allow for the production of smaller hybrid packages with advantages including being able to use more hybrid packages in devices, making the devices smaller, and/or freeing up space in said device to allow for additional components to be installed. As previously mentioned allowing for the manufacture of smaller openings in the core allows for pushing potential cavity resonances to higher frequencies than would be possible. FIG. 4 shows the circuit from FIG. 2 implemented in the new package concept. Note that the circuits are now confined in significantly smaller openings.

In some embodiments, at least one of the component are electrically coupled to at least one bonding block coupled to the second surface of the substrate. Coupling may be accomplished with, for example, wire bonding 280 (e.g., depicted in FIG. 5).

In some embodiments, core 250 may be formed from a metal (e.g., aluminum). In some embodiments, a portion of the second surface of the substrate comprises a metal layer 290 positioned between the substrate and the core. The electrical circuitry may be coupled to the metal layer which is coupled (e.g. bonded with for example epoxy) to the substrate. The metal layer may allow for electrical components (e.g., integrated circuits) to be coupled directly to the metal layer of the substrate. Metal layer 290 (e.g., depicted in FIG. 6) may provide, depending upon a thickness of the metal layer, shielding, grounding, heat removal, and/or stability. The core may be machined separately (bottomless, with openings extending through the core), placed on top of the substrate (e.g., PCB), and sealed with a top lid or cover. A metal core may either be epoxied to the substrate on which the components are positioned, or can be placed on top of a gasket to ensure higher isolation. Current state of technology uses neither and simply places a metal housing directly on a PCB's ground plane.

In some embodiments, a second component may be coupled to the second surface of the substrate outside of a perimeter of the core. By coupling electrical components directly to the substrate within the core, one may electrically couple these components through the substrate to other components coupled to the substrate outside the perimeter of the core allowing for greater flexibility. A larger substrate may be used to which a core is coupled to only a portion of the surface allowing for a variety of other components to be coupled to the substrate outside the confines of the core.

Figure 5:
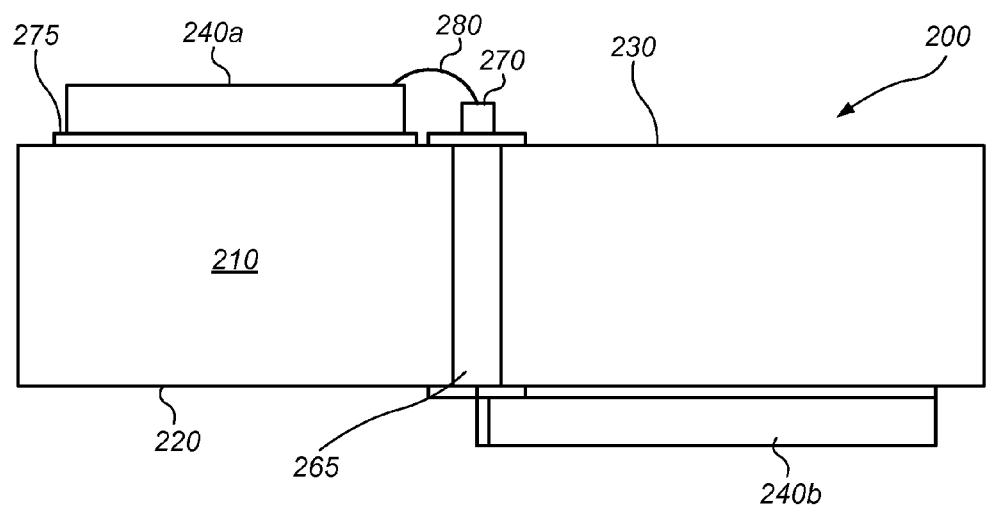
FIG. 5 depicts a cross sectional view of a portion of an embodiment of a hybrid package including multiple components coupled to opposing sides of a substrate.

In some embodiments, first component 240*a* may be coupled to second surface 230 and second component 240*b* may be coupled to first surface 220 of substrate 210. FIG. 5 depicts a cross sectional view of a portion of an embodiment of hybrid package 200 including multiple components (e.g., MMICs, thinfilm circuits, etc.) coupled to opposing sides of substrate 210. The second component may be coupled (e.g., electrically, for example using via 265) to the first component coupled to the second surface of the substrate. Using both sides of the substrate for channelized circuits further reduces circuit sizes. The top and bottom circuits may be connected with via transitions (e.g., RF), coaxial structures, bonding blocks 270, or any structure capable of providing a high frequency path. Positioning circuits on the top and bottom (as well as connecting the circuits) effectively doubles the size and functionality of circuits (e.g., microwave circuits) in a given volume. Any number of components may be coupled to the first and/or second surface of the substrate as needed depending on the application.

In some embodiments, a second core may be coupled to the first surface of the substrate. The second core may include at least one second opening extending through the second core such that the second component is positioned in at least one of the second openings.

Figure 6:
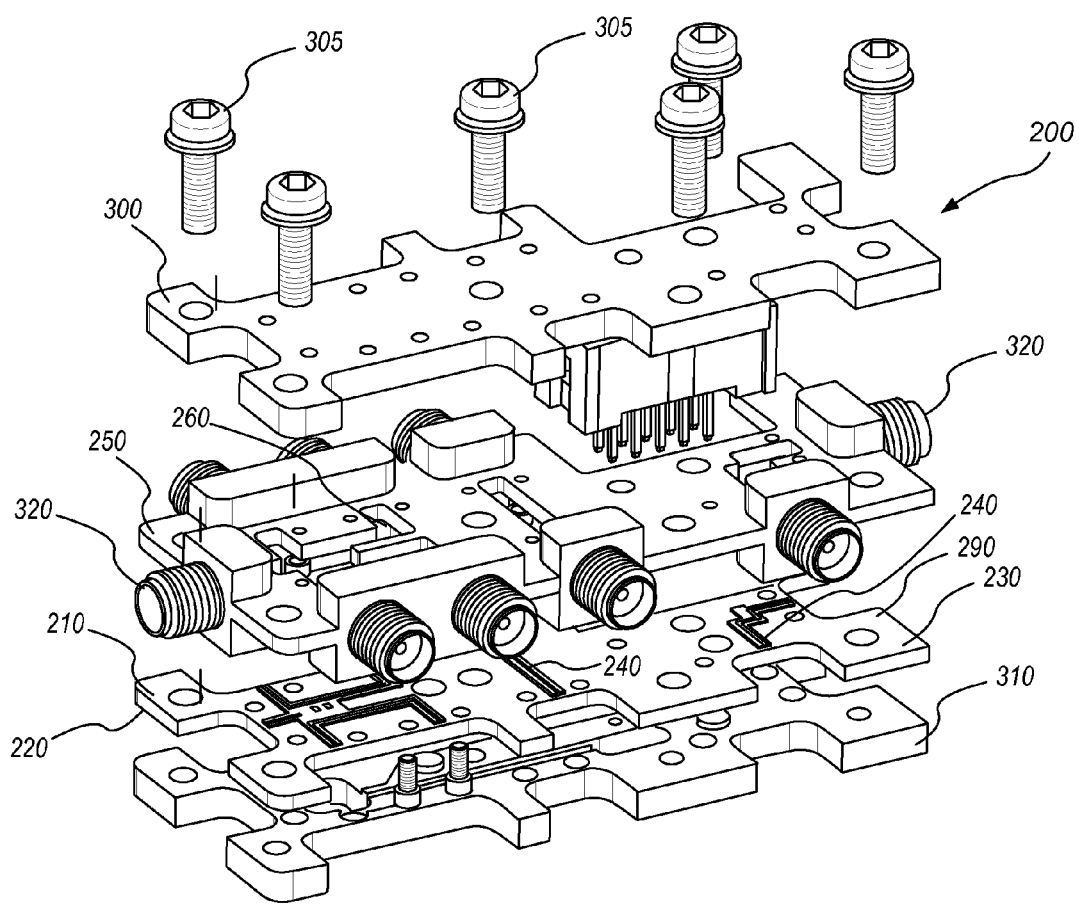
FIG. 6 depicts an exploded view of an embodiment of a hybrid package including top and bottom covers.

In some embodiments, the high frequency module may include a cover 300 coupled to core 250 (e.g., depicted in FIG. 6). The component may be positioned in an opening 260 between substrate 210 and the cover 300. The cover may be coupled to the core using one or more methods (e.g., bolts, screws 305, epoxy, etc.). The cover may provide shielding, stability, and/or grounding. In some embodiments, the cover may be formed from metal (e.g., aluminum, etc.).

FIG. 6 depicts an exploded view of an embodiment of a hybrid package 200 including first 300 and second covers 310. In some embodiments, a second cover 310 (e.g., depicted in FIG. 6) may be coupled to first surface 220 of substrate 210. The second cover may be used to cover the other side of the first surface of the substrate or may be omitted if not necessary for high frequency performance.

In some embodiments, the core may include at least one connector 320 (e.g., depicted in FIG. 6) which functions to convey a signal through the core to the component. Connector 320 may include electrical connectors, optical connectors, microwave connectors, and/or waveguide connections.

In some embodiments, at least one of the connectors includes a radio frequency connector. In some embodiments, at least one of the connectors includes a coaxial radio frequency connector.

In addition to solving the problems discussed herein regarding current technology, core embodiments described herein simplifies the assembly process. As mentioned, there's a problem with placing transition circuits that need to contact the RF connectors. Current core embodiments described herein do not have this problem because all the components (e.g., MMICs and thinfilm circuits) may be first bonded on the substrate and the machined core with the connectors then positioned on top. This allows the use of automatic pick & place machines, which improves repeatability, quality, and cost of the package.

This assembly process also eliminates any limitations of the bonding machines to get close to cavity walls, which forced the high frequency cavities to be larger than necessary. Because the cavity walls are placed after bonding, they can be made to "hug" the parameter of the microwave circuits closely which leads to the smaller cavity sizes and pushes potential cavity resonances to higher frequencies.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A high frequency module, comprising: a substrate including a first surface and a second surface substantially opposite of the first surface, wherein the substrate comprises a multi-layer printed circuit board (PCB), wherein at least one layer of the PCB is used for provision of direct current (DC) for power and control signals; a high frequency component mounted on the second surface, wherein high frequency comprises radio, microwave, and/or optical frequencies, and wherein a DC current is provided to the high frequency component using the at least one layer of the PCB; a conductive housing coupled to the second surface of the substrate, wherein the conductive housing comprises: at least one opening extending through the conductive housing, wherein the at least one opening forms a cavity, wherein the high frequency component is positioned in the cavity; and at least one connector configured to convey a high frequency signal through the conductive housing to the high frequency component; and a cover coupled to the conductive housing such that the high frequency component is positioned in the cavity between the substrate and the cover; wherein during operation, the cavity independently constrains high frequency signals to propagate through the high frequency component.

2. The module of claim 1, wherein the high frequency component comprises a monolithic microwave integrated circuit (MMIC), a resistor, or a conductor.

3. The module of claim 1, further comprising at least one bonding block coupled to the first and/or second surface of the substrate.

4. The module of claim 1, wherein the high frequency component is electrically coupled to at least one bonding block coupled to the second surface of the substrate.

5. The module of claim 1 wherein at least one of the connectors comprises a radio frequency connector, a microwave connector, a waveguide connection, or an optical connection.

6. The module of claim 1, wherein at least one of the connectors comprises a coaxial radio frequency connector.

7. The module of claim 1, wherein the conductive housing comprises a metal.

8. The module of claim 1, wherein a portion of the second surface of the substrate comprises a metal layer positioned between the substrate and the conductive housing and the high frequency component.

9. The module of claim 1, further comprising a second high frequency component coupled to the second surface of the substrate outside of a perimeter of the conductive housing.

10. The module of claim 1, further comprising a module coupled to the second surface of the substrate outside of a perimeter of the conductive housing.

11. The module of claim 1, further comprising a second high frequency component coupled to the first surface of the substrate.

12. The module of claim 1, further comprising a second high frequency component coupled to the first surface of the substrate, wherein the second high frequency component is electrically coupled to the high frequency component.

13. The module of claim 1, wherein the substrate comprises two or more substrates coupled together.

14. The module of claim 1, further comprising:
a second high frequency component coupled to the first surface of the substrate, wherein the second high frequency component is electrically coupled to the high frequency component; and
a second conductive housing coupled to the first surface of the substrate, wherein the second conductive housing comprises at least one second opening extending through the second conductive housing such that the second high frequency component is positioned in at least one of the second openings.

15. The module of claim 1, further comprising a second cover coupled to the first surface of the substrate.

16. A method of forming a high frequency module, comprising: forming a substrate including a first surface and a second surface substantially opposite of the first surface, wherein the substrate comprises a multi-layer printed circuit board (PCB), wherein at least one layer of the PCB is used for provision of direct current (DC) for power and control signals; mounting at least one high frequency component on the second surface, wherein high frequency comprises radio, microwave, and/or optical frequencies, and wherein the at least one layer of the PCB is used to provide a DC current to the high frequency component; coupling a conductive housing to the second surface of the substrate, wherein the conductive housing comprises at least one opening extending through the conductive housing that forms a cavity, wherein the at least one high component is positioned in the cavity; and coupling a cover to the conductive housing such that the at least one high frequency component is positioned in the cavity between the substrate and the cover; wherein during operation, the cavity independently constrains high frequency signals to propagate through the high frequency component.

17. The method of claim 16, further comprising providing a DC control signal to the high frequency component using the at least one layer of the PCB of the substrate.

18. The method of claim 16, further comprising conveying a high frequency signal through the conductive housing using at least one connector.

19. The method of claim 18, wherein the at least one connector comprises a radio frequency connector, a microwave connector, a waveguide connection, or an optical connection.

20. The method of claim 18, wherein the at least one connector comprises a coaxial radio frequency connector.

21. The method of claim 16, further comprising coupling at least one bonding block to the second surface of the substrate.

22. The method of claim 16, further comprising electrically coupling the at least one high frequency component to at least one bonding block coupled to the second surface of the substrate.

23. The method of claim 16, wherein the conductive housing comprises at least one electrical connector, wherein the at least one electrical connector comprises a coaxial radio frequency connector.

24. The method of claim 16, wherein the conductive housing comprises a metal.

25. The method of claim 16, wherein a portion of the second surface of the substrate comprises metal positioned between the substrate and the conductive housing and the high frequency component.

* * * * *